(12) United States Patent
Cok et al.

(10) Patent No.: US 7,250,722 B2
(45) Date of Patent: Jul. 31, 2007

(54) OLED DEVICE

(75) Inventors: Ronald S. Cok, Rochester, NY (US); Michael E. Miller, Honeoye Falls, NY (US); Andrew D. Arnold, Hilton, NY (US)

(73) Assignee: Eastman Kodak Company, Rochester, NY (US)

( * ) Notice: Subject to any disclaimer, the term of this patent is extended or adjusted under 35 U.S.C. 154(b) by 112 days.

(21) Appl. No.: 11/156,801

(22) Filed: Jun. 20, 2005

(65) Prior Publication Data

US 2005/0236981 A1 Oct. 27, 2005

Related U.S. Application Data

(63) Continuation-in-part of application No. 10/459,293, filed on Jun. 11, 2003, now Pat. No. 6,909,233.

(51) Int. Cl.
*H01J 1/62* (2006.01)

(52) U.S. Cl. ..................... 313/506; 313/504

(58) Field of Classification Search ............... 313/498, 313/503, 504, 506
See application file for complete search history.

(56) References Cited

U.S. PATENT DOCUMENTS

| | | | |
|---|---|---|---|
| 4,769,292 | A | 9/1988 | Tang et al. |
| 5,113,274 | A | 5/1992 | Takahashi et al. |
| 5,294,869 | A | 3/1994 | Tang et al. |
| 5,703,436 | A | 12/1997 | Forrest et al. |
| 6,274,980 | B1 | 8/2001 | Burrows et al. |
| 6,366,025 | B1 | 4/2002 | Yamada |
| 6,747,618 | B2 | 6/2004 | Arnold et al. |
| 2002/0024618 | A1 | 2/2002 | Imai |
| 2002/0153243 | A1 | 10/2002 | Forrest et al. |
| 2002/0186214 | A1 | 12/2002 | Siwinski |
| 2003/0089252 | A1 | 5/2003 | Sarnecki |
| 2004/0113875 | A1 | 6/2004 | Miller et al. |
| 2004/0201558 | A1 | 10/2004 | Arnold et al. |
| 2004/0217694 | A1 | 11/2004 | Cok et al. |
| 2005/0012465 | A1 | 1/2005 | Uchida |

FOREIGN PATENT DOCUMENTS

| | | |
|---|---|---|
| EP | 1 032 045 | 8/2000 |
| EP | 1 450 341 | 8/2004 |
| JP | 2000/200061 | 7/2000 |
| JP | 2003/036973 | 2/2003 |
| WO | 99/03157 | 1/1999 |
| WO | 00/11728 | 3/2000 |
| WO | 03/027998 | 4/2003 |

OTHER PUBLICATIONS

"Organic Electroluminescent Diodes"; of C. W. Tang et al; Applied Physics Letter; vol. 51; No. 12; Sep. 21, 1987; pp. 913-915.

"Electroluminescence Of Doped Organic Thin Films"; of C. W. Tang et al; Journal of Applied Physics; vol. 65; No. 9; May 1, 1989; pp. 3610-3616.

"Electroluminescence In Organic Films With Three-Layer Structure"; of Chihaya Adachi et al; Japanese Journal Of Applied Physics; vol. 27; No. 2; Feb. 1988; pp. L269-L271.

*Primary Examiner*—Vip Patel
(74) *Attorney, Agent, or Firm*—Andrew J. Anderson

(57) ABSTRACT

An OLED device, comprising, a first layer of independently addressable light emitting elements; and a second layer of independently addressable light emitting elements located on top of the first layer; wherein one of the first and second layers of independently addressable light emitting elements comprises a patterned array of red and blue light emitting elements, and the other of the first and second layers of independently addressable light emitting elements comprises an array of green light emitting elements.

19 Claims, 9 Drawing Sheets

OLED DEVICE

CROSS REFERENCE TO RELATED APPLICATIONS

This application claims priority from, and is a continuation-in-part of, commonly assigned U.S. Ser. No. 10/459,293, filed Jun. 11, 2003 now U.S. Pat. No. 6,909,233 the disclosure of which is incorporated by reference herein.

FIELD OF THE INVENTION

The present invention relates to the structure and manufacture of OLED devices, and more particularly, to flat-panel, OLED light-emitting display devices capable of creating a full-color display from two, independently addressable, light emitting element layers within the display structure.

BACKGROUND OF THE INVENTION

Light-emitting, flat-panel display devices are used for a number of applications such as general illumination light sources, decorative light sources, and information displays. Organic light-emitting diode (OLED) display devices often form an array of differently colored, light-emitting elements that are either arranged spatially in a single layer of independently addressable light emitting elements as discussed by U.S. Pat. No. 5,294,869 issued to Tang and Littman, entitled "Organic electroluminescent multicolor image display device" or are composed of three stacked layers of independently addressable light emitting elements as has been discussed by U.S. Pat. No. 5,703,436 issued to Forrest et al., entitled "Transparent Contacts for Organic Devices". To form large, high-resolution devices of either type presents significant manufacturing barriers.

The structure of an OLED typically comprises, in sequence, an anode, an organic electroluminescent (EL) medium, and a cathode. The organic EL medium disposed between the anode and the cathode is commonly comprised of an organic hole-transporting layer (HTL) and an organic electron-transporting layer (ETL). Holes and electrons recombine and emit light in the ETL near the interface of HTL/ETL. Tang et al., "Organic electroluminescent diodes", *Applied Physics Letters*, 51, 913 (1987), and U.S. Pat. No. 4,769,292, demonstrated highly efficient OLEDs using such a structure of organic material layers. Since then, numerous OLEDs with alternative organic material layer structures have been disclosed. For example, there are three organic material layer OLEDs that contain an organic light-emitting layer (LEL) between the HTL and the ETL, such as that disclosed by Adachi et al., "Electroluminescence in Organic Films with Three-Layer Structure", *Japanese Journal of Applied Physics*, 27, L269 (1988), and by Tang et al., "Electroluminescence of doped organic thin films", *Journal of Applied Physics*, 65, 3610 (1989). The LEL commonly includes a host material doped with a guest material wherein the layer structures are denoted as HTL/LEL/ETL. Further, there are other organic material layer structures that contain a hole-injecting layer (HIL), and/or an electron-injecting layer (EIL), and/or a hole-blocking layer, and/or an electron-blocking layer in the devices. These structures have further resulted in improved device performance. The term "EL unit" may be used to describe the organic material layers between and in electrical contact with a pair of electrodes, and will include at least one light-emitting layer, and more typically comprises, in sequence, a hole-transport layer, a light-emitting layer, and an electron-transport layer, denoted in brief as HTL/LEL/ETL. Devices having multiple layers of independently addressable light emitting elements will therefore have more than one EL unit stacked on top of one another wherein at least two of the EL units are positioned between separate pairs of electrodes.

The formation of a full-color display device through the spatial arrangement of different colors of emissive organic materials on a single layer of independently addressable light emitting elements requires at least three different organic materials to be deposited in a mosaic on a single layer of independently addressable light emitting elements. This mosaic must be deposited such that any one of the organic materials do not overlap a second organic material and further that each organic material appropriately overlaps electrodes that are formed to drive the organic display. Methods such as vapor deposition through a shadow mask are often used to accomplish this task. Unfortunately, accurate alignment of these precision shadow masks with the appropriate electrodes on the substrate requires a significant period of time to accomplish, slowing manufacturing. Of even greater concern is the fact that the shadow masks are typically not thermally stable and, therefore, it is difficult to maintain the exact tolerances necessary to correctly pattern the three-or-more colors of organic light-emitting materials onto a substrate. Further, the amount of thermal expansion that can occur with a shadow mask increases with increases in mask area, making this process more difficult, when forming OLED displays on large substrates. Other methods to pattern organic materials onto a substrate have been proposed and are a subject of research. However, only evaporation through a shadow mask has been successfully demonstrated in high-volume manufacturing.

To overcome this problem, organic materials may be uniformly deposited on a single layer, wherein these organic materials form an array of addressable EL units providing either a broadband emission or multiple spectral peaks. Red, green and blue color filters may then be used to filter the emission from the addressable array of EL units to form red, green, and blue subpixels. While this method has the advantage that it allows a full-color display to be made without requiring patterning of the deposited organic material, the color filters must provide a narrow pass band to form a full-color display, significantly reducing the efficiency of the display. In such a display, it is typical that less than one third of the light that is produced by the array of organic units is passed through the color filters.

It is possible to use other color filter arrangements to improve the efficiency of an OLED display with red, green and blue color filters. One particularly useful approach utilizes an unfiltered white subpixel in addition to the subpixels that are filtered using red, green, and blue color filters as described in U.S. patent application US 2004/0113875 assigned to Miller et al. and entitled "Color OLED display with improved power efficiency". Using this approach, it has been shown that the efficiency of the display device can be doubled when compared to the use of subpixels having red, green, and blue color filters. In this display configuration nearly two-thirds of the light that is produced by the organic emitter is passed through the color filters when displaying typical images. Unfortunately, the layout of the underlying circuitry required to drive a display employing a fourth subpixel in each pixel limits the resolution of the display device.

Alternatively to devices having an array of EL units producing multiple colors of light emission within a single layer of independently addressable light emitting elements, independently addressable layers of red, green and blue light emitting elements may be formed in a passive-matrix stacked OLED display structure as described by U.S. Pat. No. 5,703,436 issued to Forrest et al., entitled "Transparent Contacts for Organic Devices". A full color display device of this type is created by forming at least three layers of independently addressable light emitting elements as shown in FIG. 1. Referring to FIG. 1, a display device of this type is formed by forming a first electrode 12 on a substrate 10. An EL unit 14 (comprised of one or more light-emitting organic material layers, and optionally additional material layers as further discussed below) is then formed over the first electrode, followed by a second electrode 16. Successive EL units 18 and 22 and electrodes 20 and 24 are then formed over this second electrode 16. To form a full-color device in this way requires the formation of at least three EL units 14, 18, and 22 and four electrodes 12, 16, 20, and 24. This method has the advantage that it does not, necessarily, require the organic materials to be spatially patterned. That is, if three layers of independently addressable light emitting elements can be formed, one emitting red light, a second emitting green light, and a third emitting blue light, then a full-color display may be formed without spatially patterning the EL materials. The display device can also theoretically be higher in resolution since the red, green, and blue subpixels are formed in the same location within the array of light emitting elements that form the display device.

Unfortunately, a robust manufacturing process for forming display devices of this type has not been demonstrated and active-matrix structures for forming such displays have not been disclosed. Issues such as the need to connect four stacked electrodes to circuitry on a substrate; the lack of electrode materials that are substantially transparent and have a high enough work function to serve as a cathode; and the need for TFT structures that can be used and connected to the four separate electrodes all prohibit the robust manufacturing of devices having three or more layers of independently addressable light emitting elements.

Multi-color displays having multiple layers of independently addressable light emitting elements have also been discussed in the prior art that are formed having two emissive layers of independently addressable light emitting elements. U.S. Patent Application 2005/0012465 filed by Uchida and entitled "Organic electroluminescent device, method for driving the same, illumination device, and electronic apparatus" describes such an OLED device structure. In this device structure, three electrodes are formed on a substrate wherein the center electrode and one of the first and third electrodes have transparency. An EL unit is formed between each pair of electrodes. This device is driven such that by switching between a forward driving in which the first and third electrodes serve as anodes and inverse driving where the first and third electrodes serve as cathodes either the first or second EL unit is driven with a forward bias and emits light while the remaining EL unit is simultaneously driven with a reverse bias and does not emit light. By driving this display device in this way, the device may emit either the color of light produced by the first or the second EL unit. If the drive is switched from forward to inverse bias quickly enough, both EL units are perceived as emitting light and the device is perceived as emitting a mixture of the color of light produced by the first and second EL unit. Such a device structure does not require the first and third electrodes to be driven independently of one another, potentially reducing the circuitry required to drive the display device. This patent application does not, however, describe a full-color display device or provide an active matrix means for driving the display device.

Full color displays having two layers of independently addressable light emitting elements have also been disclosed. U.S. Pat. No. 6,747,618 issued to Arnold et al. and entitled "Color organic light emitting diode display with improved lifetime" discusses a display having a layer of independently addressable blue light emitting elements above which are patterned an array of red and green EL units to form a second layer of independently addressable light emitting elements capable of providing red and green light. Such a display device provides a longer lifetime since the blue light emitting OLEDs generally have a shorter lifetime than red or green light emitting OLEDs and this structure allows the area of blue light emitting diodes to be increased, decreasing the current density required to drive the OLEDs which, in turn, allows the OLED to operate in a more stable domain, thereby increasing its lifetime.

It is further known in the art that the human eye is less sensitive to spatial detail in low luminance colors than in high luminance colors. For this reason, displays, having a single layer of light emission, have been suggested which include fewer blue and/or red light-emitting elements than green. For example, U.S. Pat. No. 5,113,274 issued to Takahashi et al. and entitled "Matrix-type color liquid crystal display device" provides for a liquid crystal display that consists of a matrix of light-emitting elements wherein fewer red and blue light emitting elements are employed than green light-emitting elements. However, this principle has not been applied display structures having more than one layer of independently addressable light emitting elements.

There is a need, therefore, for an OLED device structure that reduces the tolerances for patterning different OLED materials, has a high efficiency, has the capability for forming a high resolution display device, and that is simpler to construct than a device having three-or-more layers of independently addressable light emitting elements.

SUMMARY OF THE INVENTION

In accordance with one embodiment, the invention is directed towards an OLED device, comprising, a first layer of independently addressable light emitting elements; and a second layer of independently addressable light emitting elements located on top of the first layer; wherein one of the first and second layers of independently addressable light emitting elements comprises a patterned array of red and blue light emitting elements, and the other of the first and second layers of independently addressable light emitting elements comprises an array of green light emitting elements.

In accordance with a further specific embodiment, the invention is directed towards an OLED device, comprising: a plurality of light emitting elements each comprising an EL unit positioned between and in electrical contact with a pair of electrodes, including individually addressable light emitting elements for emitting red, green and blue colored light, wherein the red and blue light emitting elements are patterned in an array in a common layer and are stacked above or below an array of green light emitting elements.

DETAILED DESCRIPTION OF THE INVENTION

Figure 1:
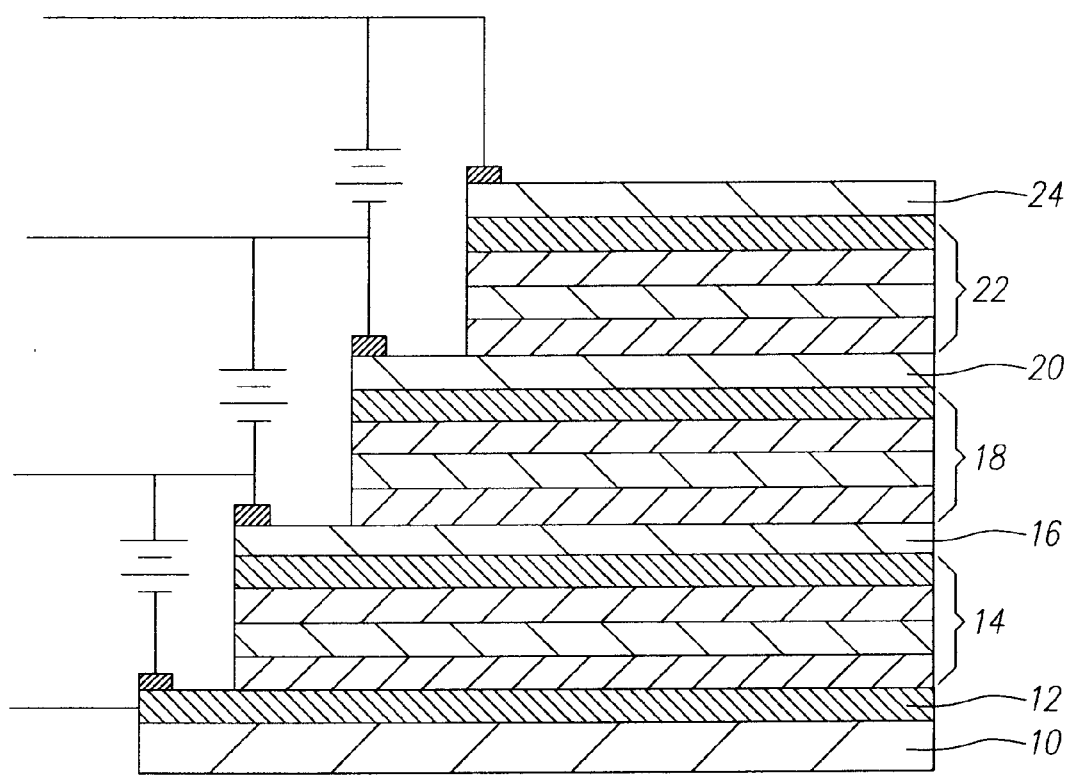
FIG. 1 is a diagram showing a longitudinal cross section of a prior-art device configuration.

The present invention provides an OLED device structure that reduces the tolerance for spatially patterning different EL materials, has a high efficiency, has the capability for forming a high-resolution display device and is simpler to construct than display devices comprising three-or-more stacked layer of colored independently addressable light emitting elements that has been disclosed in the prior art.

In parent application U.S. Ser. No. 10/459,293, OLED devices are described including various arrangements of stacked white light and colored light emitting elements. In one embodiment, an OLED device is illustrated comprising layers of independently addressable light emitting elements, including a first layer comprised of a patterned array of red and blue light emitting elements, a second layer comprised of an array of green light emitting elements, and a third layer comprised of an array of white light emitting elements. In such embodiment, each green light emitting element is stacked with either a red light emitting element or with a blue light emitting element, and the combination of green and red stacks and green and blue stacks enable full color to be obtained from only two layers of colored light emitting elements.

In a first specific embodiment of the present invention, the OLED device is comprised of a first layer of independently addressable light emitting elements and a second layer of independently addressable light emitting elements located on top of the first layer. In this device, one of the first and second layers of independently addressable light emitting elements comprises a patterned array of red and blue light emitting elements, and the other of the first and second layers of independently addressable light emitting elements comprises an array of green light emitting elements. The plurality of light emitting elements are each further comprised of an EL unit positioned between and in electrical contact with a pair of electrodes, including individually addressable light emitting elements for emitting red, green and blue colored light, wherein the red and blue light emitting elements are patterned in an array in a common layer and are stacked above or below an array of green light emitting elements.

It should be recognized that the human visual system is generally sensitive to energy in the electromagnetic spectrum between about 380 and 700 nm. For the purpose of this disclosure, this portion of the electromagnetic spectrum will be referred to as the visible spectrum. Further within this disclosure, the blue light emitting elements will emit light primarily in the blue portion of the visible spectrum, which is the portion having wavelengths between about 380 and 490 nm. Green light emitting elements will emit light primarily in the green portion of the visible spectrum which is the portion having wavelengths between about 490 and 575 nm. Red light emitting elements will emit light primarily in the red portion of the visible spectrum which is the portion having wavelengths between about 575 and 700 nm. Light emitting elements that emit light primarily within a portion of the visible spectrum preferably emit at least 50 percent (more preferably at least 70, and most preferably at least 90 percent) of the integrated radiance within the portion of the visible spectrum.

A device of the current invention includes one layer of independently addressable green light emitting elements. Within such a configuration, the formation of the first EL unit does not require the EL materials to be patterned and provides a high resolution, high-luminance emitting layer. As such, the array of EL units that are used in construction of the green light emitting elements may be formed without patterning. To form a device with vapor deposition, this attribute of the display device allows the green EL units to potentially be formed without a shadowmask, forgoing the mask alignment step and avoiding mask alignment errors.

The second layer of independently addressable light emitting elements will then be composed of EL units that emit light primarily within the red portion of the visible spectrum, as well as EL units that emit light primarily within the blue portion of the visible spectrum together with a pair of electrodes. The formation of this layer of independently addressable light emitting elements requires at least the red and blue light emitting materials to be patterned. However, under the most stringent conditions; a red, green and blue light emitting device requires only two light emitting materials (i.e., red and blue light emitting materials) to be patterned to form a three-color subpixel rather than the three light emitting materials required to form a pixel in a traditional OLED having a single layer of independently addressable light emitting elements. Therefore, the necessary resolution of the masking process (e.g., shadow mask) is reduced by a factor of at least one third. Further, as will be discussed in more detail later, since the human eye is more sensitive to spatial information in the high luminance colors, it is possible to form a device having the same perceived resolution with fewer pixels when there are twice as many green light-emitting as red or blue light emitting elements.

Such a device structure requires the formation of a device having two layers of independently addressable light emitting elements. However, the use of two EL units between two pairs of electrodes, instead of three layers of independently addressable light emitting elements as disclosed by Forrest et al., in U.S. Pat. No. 5,703,436, simplifies connectivity of the electrodes within the display device, as well as, reduces the number of manufacturing steps and manufacturing complexity. While full color display devices employing two stacked layers have been disclosed, these devices have not taken advantage of the human eye's differential sensitivity to different wavelengths of electromagnetic energy to provide a display device having a higher perceived resolution and higher image quality.

The present invention can be employed in several OLED device configurations. These include simple structures that may comprise at least three electrode layers forming the first and second pairs of electrodes, such as passive matrix-displays comprised of orthogonal arrays of patterned electrode layers to form pixels, and active-matrix displays where each light emitting element is controlled independently, for example, with a thin-film transistor (TFT). There are numerous configurations of the light emitting elements wherein the present invention can be successfully practiced.

Figure 2:
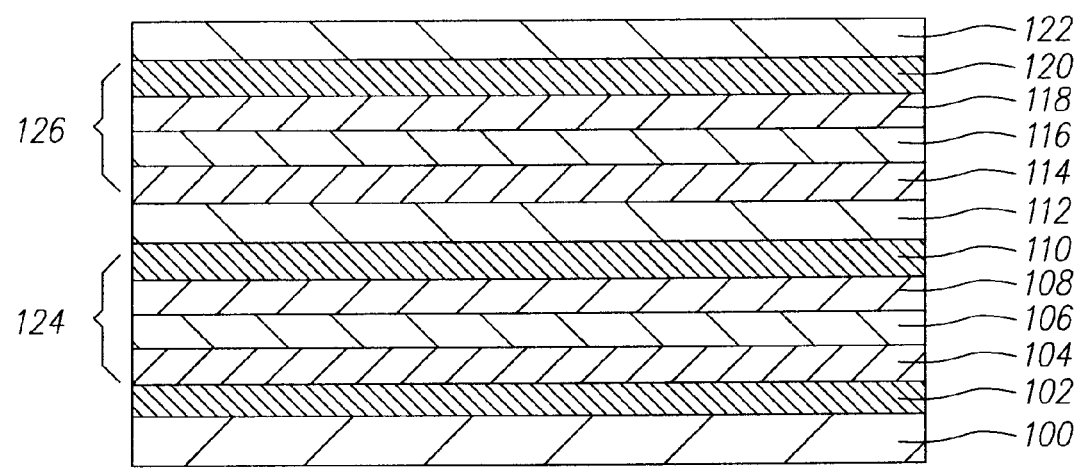
FIG. 2 is a diagram showing a longitudinal cross section of an OLED device of the present invention.

A typical structure of a portion of the device, including portions of two light-emitting elements that form two layers of independently addressable light emitting elements of the present invention is shown in FIG. 2 and is comprised of a substrate 100, a first electrode 102, a first optional hole-injecting layer 104, a first hole-transporting layer 106, a first light-emitting layer 108, a first electron-transporting layer 110, a second electrode 112, a second optional hole-injecting layer 114, a second hole-transporting layer 116, a second light-emitting layer 118, a second electron-transporting layer 120 and a third electrode 122. In such embodiments, electrodes 102 and 112 constitute a first pair of electrodes, and layers 104, 106, 108, 110 constitute a first EL unit positioned between and in electrical contact with such first pair of electrodes. Similarly, electrodes 112 and 122 constitute a second pair of electrodes, and layers 114, 116, 118, 120 constitute a second EL unit positioned between and in electrical contact with such second pair of electrodes. These layers are described in detail below. The substrate may alternatively be located adjacent to the third electrode, or the substrate may actually constitute the first or third electrodes.

To simplify the discussion of the particularly illustrated embodiment, the EL unit comprising a combination of the first optional hole-injecting layer 104, the first hole-transporting layer 106, the first light-emitting layer 108, and the first electron-transporting layer 110 will be referred to as the bottom EL unit 124, and the EL unit comprising a combination of the second optional hole-injecting layer 114, the second hole-transporting layer 116, the second light-emitting layer 118, and the second electron-transporting layer 120 will be referred to as the top EL unit 126. The total combined thickness of the organic layers within each EL unit is preferably less than 500 nm.

In a preferred embodiment of this device structure, each of the three electrodes will be independently addressable, allowing simultaneous, independent control of the two EL units. However, it should be recognized that simultaneous, independent control of the two EL units is not necessary and that other device structures that enable time-sequential, independent control of the two EL units such as those included in U.S. Patent Application 2005/0012465, which is herein included by reference, are also useful in practicing this invention.

To provide simultaneous, independent control of the two EL units, it must be possible to simultaneously and independently provide a positive bias across each EL unit. Within a preferred bottom-emitting embodiment, this will be accomplished by allowing the second electrode 112 to provide a reference voltage while a positive electrical potential is created across the bottom EL 124 unit by increasing the voltage to the first electrode 102 with respect to the reference voltage of the second electrode 112 to create a positive voltage differential between the second electrode 112 and the first electrode 102. This voltage differential will create a positive electrical potential between the hole-injecting layer 104 and the electron transport layer 110 of the bottom EL unit 124. Simultaneously, an independent, positive electrical potential may be created across the top EL unit 126 by decreasing the voltage of the third electrode 122 with respect to the second electrode 112 to create a negative voltage differential between the third 122 and second electrode 112. This voltage differential will create a positive electrical potential between the hole-injecting layer 114 and the electron transport layer 120 of the top EL unit 126. Alternatively, the third electrode 122 may create a positive voltage differential between the third 122 and second electrode 112 similar to the positive voltage differential between the first 102 and second electrode 112 if the order of the layers in the top EL 126 is reversed. Such an arrangement may reduce the number of different voltages necessary to operate the OLED device.

Each of the layers of this device is further described for clarification.

Substrate

The OLED device of this invention is typically provided over a supporting substrate 100. The electrode nearest the substrate is conveniently referred to as the bottom electrode. The substrate can either be light-transmissive or opaque, depending on the intended direction of light emission. The light-transmissive property is desirable for viewing the EL emission through the substrate. Transparent glass or plastic is commonly employed in such cases. For applications where the EL emission is not viewed through the bottom electrode, the transmissive characteristic of the bottom support is immaterial, and therefore can be light transmissive, light absorbing or light reflective. Substrates for use in this case include, but are not limited to, glass, plastic, semiconductor materials, silicon, ceramics, and circuit board materials. Of course in these device configurations, the remaining electrodes must be semi-transparent or transparent.

Electrodes

When EL emission is viewed through either the first 102 or the third 122 electrode, the electrode should be transparent or substantially transparent to the emission of interest. Generally, the remaining of the first 102 or third 122 electrodes will be reflective. The second electrode 112 will also be transparent or semi-transparent to the emission of interest.

For the electrodes that serve as an anode, common transparent anode materials may be used in this invention, including indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is not viewed through one of the electrodes, the transmissive characteristics of the electrode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater.

Desirable materials for the electrodes that serve as a cathode should have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bi-layers comprising a thin electron-injection layer (EIL) in contact with the organic layer (e.g., ETL), which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862, and 6,140,763.

When light emission is viewed through an electrode that serves as the cathode, the electrode must be transparent or semi-transparent. For such applications, metals must be thin or one must use transparent conductive oxides, or a combination of these materials. Optically transparent cathodes have been described in more detail in US 4,885,211, US 5,247,190, JP 3,234,963, US 5,703,436, US 5,608,287, US 5,837,391, US 5,677,572, US 5,776,622, US 5,776,623, US 5,714,838, US 5,969,474, US 5,739,545, US 5,981,306, US 6,137,223, US 6,140,763, US 6,172,459, EP 1 076 368, and US 6,278,236. Electrode materials are typically deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Hole-Injecting Layers (HIL)

It is often useful to provide hole-injecting layers 104 and 114 between the first electrode 102 and the first hole-transporting layer 106 as well as between the second electrode 112 and the second hole-transporting layer 116. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1 029 909 A1.

Hole-Transporting Layers (HTL)

The hole-transporting layers 106 and 116 contain at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]-p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layers (LEL)

As more fully described in U.S. Pat. Nos. 4,769,292 and 5,935,721, the light-emitting layers (LEL) 108 and 118 of the first and second EL units 124 and 126 include a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-µ-oxo-bis(2-methyl-8-quinolinolato) aluminum(III)
CO-5: Indium trisoxine [alias, tris(8-quinolinolato)indium]
CO-6: Aluminum tris(5-methyloxine) [alias, tris(5-methyl-8-quinolinolato) aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof, distyrylarylene derivatives as described in U.S. Pat. No. 5,121,029, and benzazole derivatives, for example, 2,2',2"-(1,3,5-phenylene)tris[1-phenyl-1H-benzimidazole].

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives and carbostyryl compounds.

Electron-Transporting Layers (ETL)

Preferred thin film-forming materials for use in forming the electron-transporting layers 110 and 120 of the EL units of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, layers 110 and 108, as well as layers 120 and 118 can optionally be collapsed into a single layer that serve the function of supporting both light emission and electron transport. These layers can be collapsed in both small-molecule OLED systems and in polymeric OLED systems. For example, in polymeric systems, it is common to employ a hole-transporting layer such as PEDOT-PSS with a polymeric light-emitting layer such as PPV. In this system, PPV serves the function of supporting both light emission and electron transport.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

Tandem Structures

Although the embodiment depicted in FIG. 2 illustrates single bottom 124 and top 126 EL units located between electrode pairs 102,112 and 112,122, respectively, one or both of these pairs of electrodes may have multiple EL units operating in tandem positioned there between as disclosed in US 2003/0170491 filed by Liao and Tang and entitled "Providing an organic electroluminescent device having stacked electroluminescent units" and US 2003/0189401 filed by Kido and Hayashi and entitled "Organic electroluminescent device". In such a tandem device, a plurality of light-emitting layers are provided between a pair of electrodes, thereby increasing the amount of light emitted at the cost of an increased driving voltage. Within these structures a connecting layer is often coated between successive layers of HIL, HTL, LEL, and ETL. Such a connecting layer may also be formed from a hole-transporting layer and an electron-transporting layer.

Having described each of the layers in detail, preferred embodiments may be further described.

Figure 3:
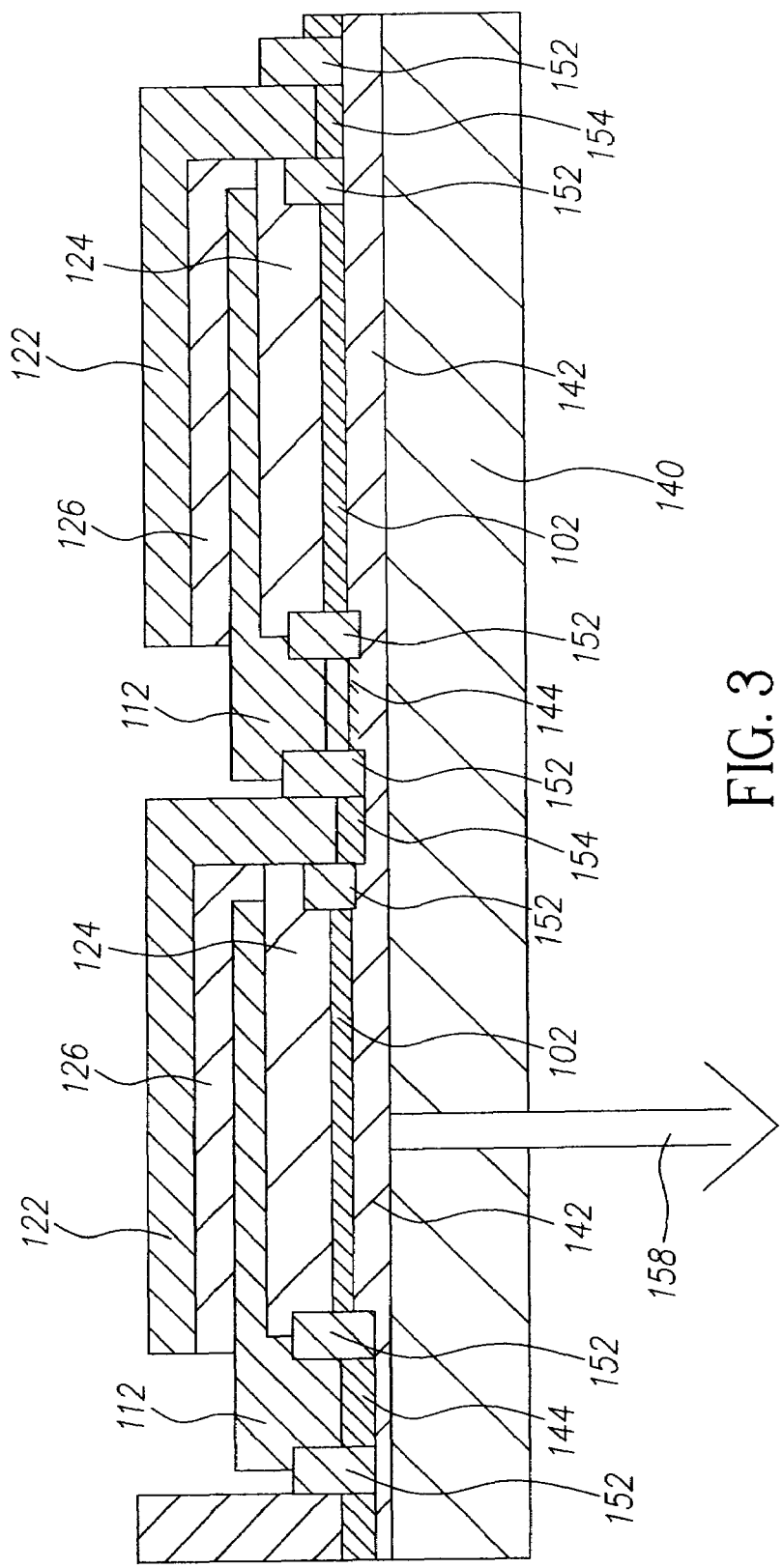
FIG. 3 is a longitudinal cross section of a bottom-emitting display device of the present invention.

A schematic cross section of a bottom-emitting, active-matrix embodiment of this invention is shown in FIG. 3. As shown in this figure, the active-matrix structure will typically be formed on a substrate 140. Light emission 158 will occur through this substrate. On this substrate, a drive circuitry layer 142 will be formed that contains thin-film transistors and other drive circuitry to drive the device as is known in the art. Over this drive circuitry, the first electrode 102 will be patterned. Within this bottom-emitting configuration, this first electrode will preferably be transparent. A first connector 144 for the second 112 electrode will also be formed such that it is not in contact with the first 102 and third 122 electrode. A second connector 154, used to connect the third 122 electrode to the TFT layer, will also be formed. This connector 154 and the third electrode 122 will not be in electrical contact with the first 102 or second 112 electrodes. A planarization layer 152 will be patterned to electrically isolate the first connector 144 from both the first electrode 102 and the second connector 154. The bottom EL unit 124 will be formed over the first electrode 102 in such a way that a via will be provided to allow the second 112 and third 122 electrodes to be connected to the first 144 and second 154 connector, respectively. The second electrode 112 is then formed on top of the bottom EL unit 124 and surrounding area, such that it forms an electrical connection with the first connector 144. The top EL unit 126 is then formed over the second electrode 112. Finally the third electrode 122 is formed over the top EL unit 126 in such a way that it forms an electrical connection with the second connector 154. As such, an OLED device, is formed having a first layer of independently addressable light emitting elements that are formed from first electrode 102, the first EL unit 124 and second electrode 112; a second layer of independently addressable light emitting elements located on top of the first layer which is formed from the second electrode 112, the second EL unit 126 and the third electrode 122. In accordance with one embodiment of the invention, one of the first and second layers of independently addressable light emitting elements comprises a patterned array of red and blue light emitting elements, and the other of the first and second layers of independently addressable light emitting elements comprises an array of green light emitting elements.

It should be noted that many of the steps required in the manufacture of such a device are well known in the art. The creation of vias between the second electrode 112 and its connector 144 as well as the vias between the third electrode 122 and its connector 154 are not required within some OLED device constructs. While these vias may be formed in any number of ways, one method is to form the bottom EL unit 124 over the entire substrate (e.g., by a common vapor deposition step). Vias are then formed to connect the second electrode 112 to its connector 144 using laser ablation or other method for removing a small area of the organic material as is known in the art. The second electrode 112 is then formed over the bottom EL unit 124, this deposition step allows the connection of the second electrode to its connector 144. This electrode may be formed to be continuous if it serves as either the cathode or anode for both the top and bottom EL units but may be patterned, using commonly known patterning methods, such as vapor deposition through a shadowmask to an electrode that is electrically isolated from all neighboring subpixels. Note that in the instance where the second electrode 112 is formed to be continuous, it is not necessary that the vias be created at every light emitting element but instead may be created on in a less frequent pattern. The top EL unit 126 is then formed using an approach that allows it to be patterned, such as patterned vapor deposition through a shadowmask, or patterned laser transfer deposition from a donor sheet. Laser ablation may again be applied to create a via through the bottom EL unit 124, the second electrode 112 and the top EL unit 126 to the connecting pad for the third electrode. Finally, the third electrode 122 is formed and will generally also be formed using a patterning process, such as deposition through a shadowmask. Other manufacturing steps may also be used to connect each of the top two electrodes to their connecting pads. It will generally be necessary to pattern at least the second 112 and/or third 122 electrodes. This step will generally be formed using deposition through a shadowmask but may be formed by applying any of the methods mentioned previously. Note that according to the invention, at least one of the light emitting layers (108, 118) within either the top 126 or bottom 124 EL unit must be patterned to practice the current invention. This patterning step may be performed using any of the methods describe above.

Figure 4:
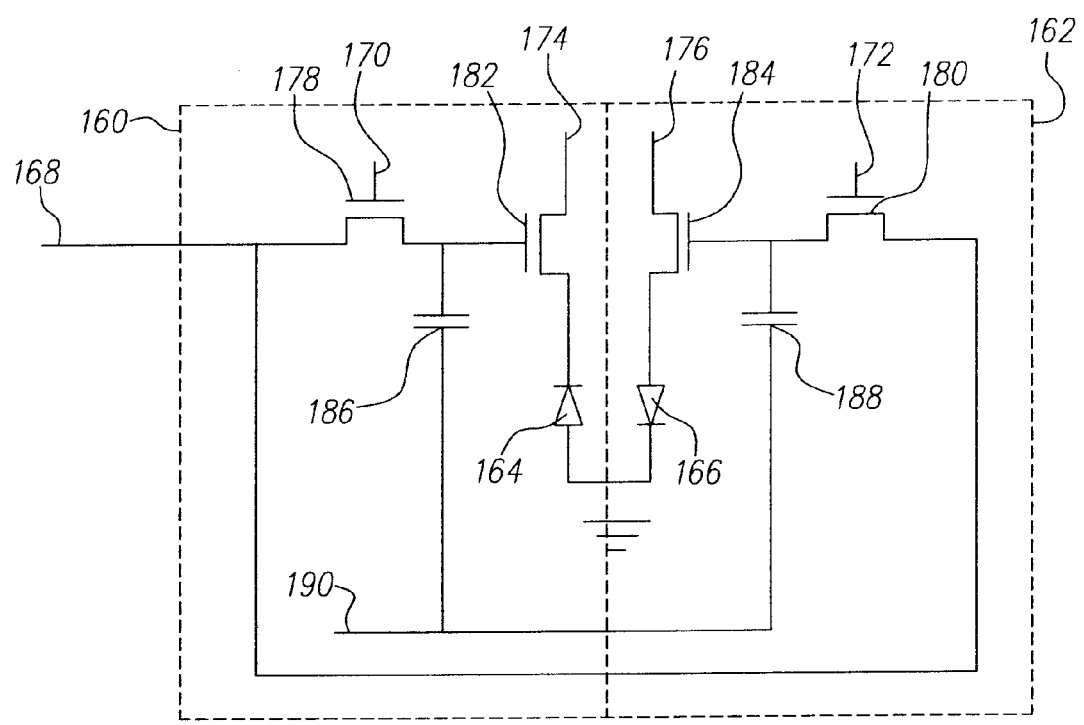
FIG. 4 is a diagram showing a circuit useful in driving a light-emitting element within the current invention.

The display device shown in FIG. 3 will employ an active matrix of thin-film transistors (TFTs) to drive the light-emitting elements. Although it is possible to simply provide two separate TFT circuits to drive each light-emitting element within the display device, it is possible to share drive and capacitor lines for each light-emitting element, providing some simplification of the panel layout. One such circuit useful in driving the display and that shares drive and capacitor lines is shown in FIG. 4. Utilizing this circuit a device is formed in which the bottom 124 and top 126 EL units may each be separately controlled to independently drive the two EL units to selected illumination levels through the use of separate electrical potentials. As shown in this figure, the circuit to drive each light-emitting element may consist of two mirrored sub-circuits (160 and 162) wherein each sub-circuit is a circuit known in the art as being useful in driving an active-matrix OLED display. The first sub-circuit 160 is used to drive the diode 164 formed from the bottom EL unit 124. The second sub-circuit 162 is used to drive the diode 166 formed from the top EL unit 126. It will be recognized by one skilled in the art that each sub-circuit is a known circuit useful for driving a traditional single-layer OLED and as such, other commonly known circuits, such as those employing current mirrors or other enhancements, may be mirrored and utilized as a sub-circuit in a similar way to drive a light-emitting element of the current embodiment.

Within this circuit, the two, mirrored sub-circuits (160 and 162) share an input data line 168. Either the first 164 or second 166 diode may be selected through activating the first 170 or second 172 select line. Power with a positive potential is provided by the first power line 174 while power with a negative potential is provided by the second power line 176. A voltage is provided on the data line 168, which provides a drive voltage for either the first 164 or second 166 diode. To operate the circuit, a voltage signal is applied to the first select line 170 that turns on the first transistor 178. The light output level for the bottom EL unit is controlled by a voltage signal, which has been set on the data line 168. The first storage capacitor 186 is then charged to the voltage level of the data line associated with that EL unit and maintains the data voltage until the row is selected again during the time the select line is selected during the next image frame. The storage capacitor 186 is connected to the gate of the second transistor 182, which serves as a power transistor so that the voltage level held on the storage capacitor 186 regulates the current flow through the second transistor 182 to the organic light-emitting diode 164 and thereby controls the light output of the EL units 124. The EL unit is then un-selected by applying a voltage signal to the select line 170, which turns off the select transistor.

To illuminate the top EL unit 126, the drive voltage that is intended for the top EL unit 126 is provided on the data line 168. A voltage signal is applied to the second select line 172 that turns on the third transistor 180. The light output level for the EL unit 126 is controlled by a voltage signal, which has been set on the data line 168. The second storage capacitor 188 is then charged to the voltage level of the data line associated with that EL unit and maintains the data voltage until the row is selected again during the time the select line is selected during the next image frame. The second storage capacitor 188 is connected to the gate of the fourth transistor 184, which serves as a power transistor so that the voltage level held on the second storage capacitor 188 regulates the current flow through the fourth transistor 184 to the organic light-emitting diode 166 and thereby controls the light output of the second EL unit 126. The EL unit is then un-selected by applying a voltage signal to the second select line 172, which turns off the second select transistor 180. In an alternative embodiment, separate data lines are employed and connected to transistors 178 and 180 while a common select line is connected to 170 and 172. In this embodiment, both capacitors 186 and 188 may be charged simultaneously, doubling the refresh rate for the device at the cost of additional data driver circuitry.

When this circuit is implemented within a pixilated display device, each light-emitting element in the display device will be activated using this approach. This is typically done starting with light-emitting elements in the first row of the device and progressing down the display, selecting one row at a time. Within the display device, all light-emitting elements in a row, typically corresponding with the direction of the select lines 170 and 172 are updated. The next row of the light-emitting elements within the display device is selected and light-emitting elements within that row are updated. This process is repeated for the entire display, lighting the bottom EL unit 124 within the entire display to the desired luminance, followed by illuminating the top EL unit 126 within each row to the desired luminance. Once the data is refreshed in each EL unit within a light-emitting element, the EL units maintain their desired luminance until updated on the next refresh cycle.

In certain embodiments of the invention, it may be preferable to employ at least one semi-reflective, semi-transparent electrode and to form a microcavity within one layer of light emitting elements. Referring back to FIG. 3, e.g., in a bottom-emitting configuration the green light-emitting layer is preferably employed in the top EL unit 126. To construct a uniform microcavity across the entire EL unit, the third electrode 122 will be reflective and the second electrode 112 will be semi-transparent and semi-reflective. This microcavity is used to narrow the wavelength band and enhance the efficiency of the on-axis green emission. In this embodiment the microcavity will not typically be used as a selective color filter. However, it is possible to do so to create more than one color of green emission. In this specific embodiment, light-emitting materials that produce a peak emission in the blue and red portions of the spectrum, are employed in the bottom EL unit 124.

Figure 5:
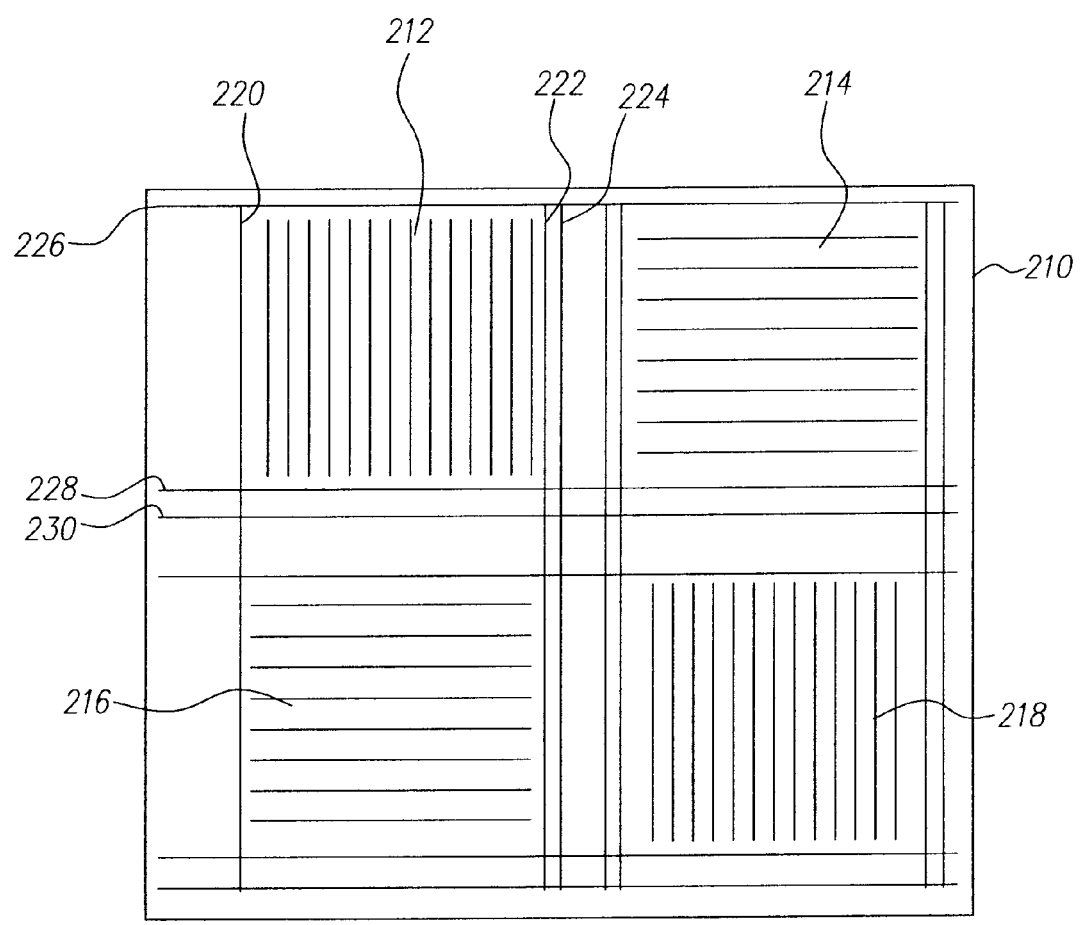
FIG. 5 depicts an arrangement of light-emitting elements useful in practicing an embodiment of the present invention.

Although the light-emitting elements may be arranged into any number of potential arrangements, one particularly useful display configuration consists of red, green, and blue light-emitting elements, wherein the location of the red and blue light-emitting elements are interspersed along a row or column of the display device, and more particularly wherein the location of the red and blue light-emitting elements are interspersed along both rows and columns of the display device. FIG. 5, e.g., depicts a portion of a display device 210, comprised of four stacks of two light emitting elements each, arranged to form four subpixel areas (212, 214, 216, and 218) within the display device as viewed from above. Each of the four subpixel areas in this display device contains both a bottom 124 and a top 126 EL unit and are composed of two light emitting elements. Each subpixel area will typically have two associated power lines 220 and 224, at least one associated data line 222, two associated select lines 226 and 228 and at least one associated capacitor line 230 as are necessary to drive the circuit depicted in FIG. 4. As such the two light emitting elements within any subpixel area will share a data line. Within the display device shown in FIG. 5, the second 214 and third 216 subpixel areas shown consist of light emitting elements that emit green and blue light, respectively. As such, when the bottom EL unit 124 is activated, blue light is emitted within the subpixel areas 214 and 216. When the top EL unit 126 is activated within subpixel areas 214 and 216, green light is emitted. When both the bottom EL unit 124 and the top EL unit 126 are employed together within subpixel areas 214 and 216, green and blue light is generated and a combination of blue and green light to is emitted within these subpixel areas. As such, blue light, green light or any combination of these two colors of light may be produced within subpixel areas 214 and 216.

The first 212 and fourth 218 subpixel areas contain a bottom EL unit 124 that emits red light, forming a red light emitting element, and a top EL unit 126 that emits green light, forming a green light emitting element. As such, when the bottom EL unit 124 is activated within the first 212 or fourth 218 subpixel areas, red light is emitted by the red light emitting elements within subpixel areas 212 and 218. When the top EL unit 126 is activated green light is generated and emitted within light-emitting elements in subpixel areas 212 and 218. When both the bottom EL unit 124 and the top EL unit 126 are employed together within subpixel areas 212 and 218, a combination of red and green light is generated and emitted by the device. Therefore, the light-emitting elements within subpixel areas 214 and 216 may each produce red light, green light or any combination thereof.

In such a device, the array of top EL units 126 produce green light, forming a first layer of independently addressable green light emitting elements while the array of bottom EL units 124 produce either red or blue light, producing an array of independently addressable light emitting elements that produce red or blue. As such, the display device may produce the three primary colors necessary to provide a full-color display device. Further, such a display device takes advantage of the fact that the resolution of the human eye for the high-luminous green channel is higher than the resolution of the human eye for the lower-luminous red and blue channels within the display device, providing more green light-emitting elements than red or blue. Constructing the display device in this way allows a high-quality image to be presented to the observer with a minimal number of light-emitting elements. It has been demonstrated by the authors that as long as the angle subtended by each light-emitting element is less than one minute of arc at the user's eye, a display device having this configuration will be perceived to have image quality as high as in a display device having a single layer of EL units with three times as many light-emitting elements as are required for the display that has been described. If the light-emitting elements are large enough to subtend more than one minute of arc when arranged as a series of squares as shown in FIG. 5, artifacts may be eliminated by elongating the light-emitting elements in one direction and increasing the number of light-emitting elements in the orthogonal direction to reduce the angle subtended by the light-emitting element in at least one direction; this will generally eliminate the artifact.

Since each light-emitting element within one layer will emit green and only every other light-emitting element within the other layer will emit blue or red light, one would expect the red and blue light emitting elements to be driven with higher average current densities to achieve higher radiant output than the green light emitting elements. Since higher current densities typically result in shorter device lifetimes, one can expect the red and blue light emitting elements to have a shorter lifetime than the green light emitting elements. In accordance with a preferred embodiment, the red and blue emitters may be formed using a tandem emitter, such as described in US 2003/0170491 and US 2003/0189401 referenced above. The use of a tandem emitter will lower the current density required to produce the same light output and extend the lifetime of these emitters. Generally, 2 or 3 tandem layers may be required within the red or blue light emitting elements to balance the lifetime of the red, blue and green emitting materials. Further, since blue-light emitting materials generally have a shorter lifetime than the red light-emitting materials, the sizes of the light emitting elements or the number of tandem layers may be adjusted to provide the largest of the red and blue areas to the emitting material with the shortest lifetime.

It should be noted that by providing a green light emitting element at each spatial location that produces high luminous light, images produced with the display will generally be perceived as higher in quality than displays having a single layer. In fact, it is possible to design the layout of the display device shown in FIG. 3 such that neighboring green light-emitting elements share the same drive circuit. Even under these circumstances a display of the present invention may be constructed having two-thirds the light emitting elements as a display having a single layer of independently addressable light emitting elements and be perceived as higher in quality.

Note that while FIG. 3 shows a second electrode that is patterned, it is not necessary that this electrode be patterned and it may instead be formed from a uniform coating. In this configuration, the size and shape of contiguous portions of the patterned first and third electrodes, together with the size and shape of contiguous portions of the patterned second EL unit, define the size and shape of the light-emitting elements within each layer. Therefore, it is not necessary that two green light-emitting elements be formed, each under a red or blue light-emitting element but instead a single green light-emitting element may be formed in the first EL unit that has the same area and shape of a both a blue and a red light-emitting element within the second EL unit. In fact, within this configuration, the sizes and shapes of each light emitting emitter may vary independently of one another.

Figure 6:
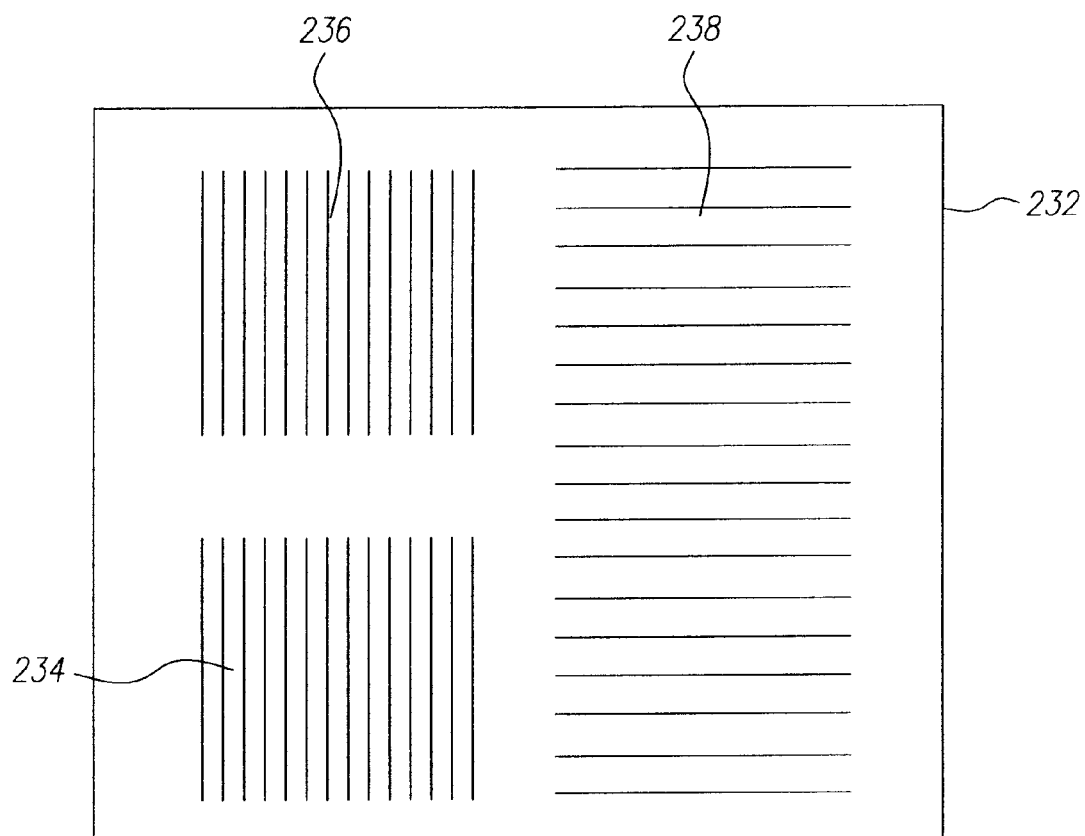
FIG. 6 depicts an alternate arrangement of light-emitting elements useful in practicing an embodiment of the present invention.
Figure 7:
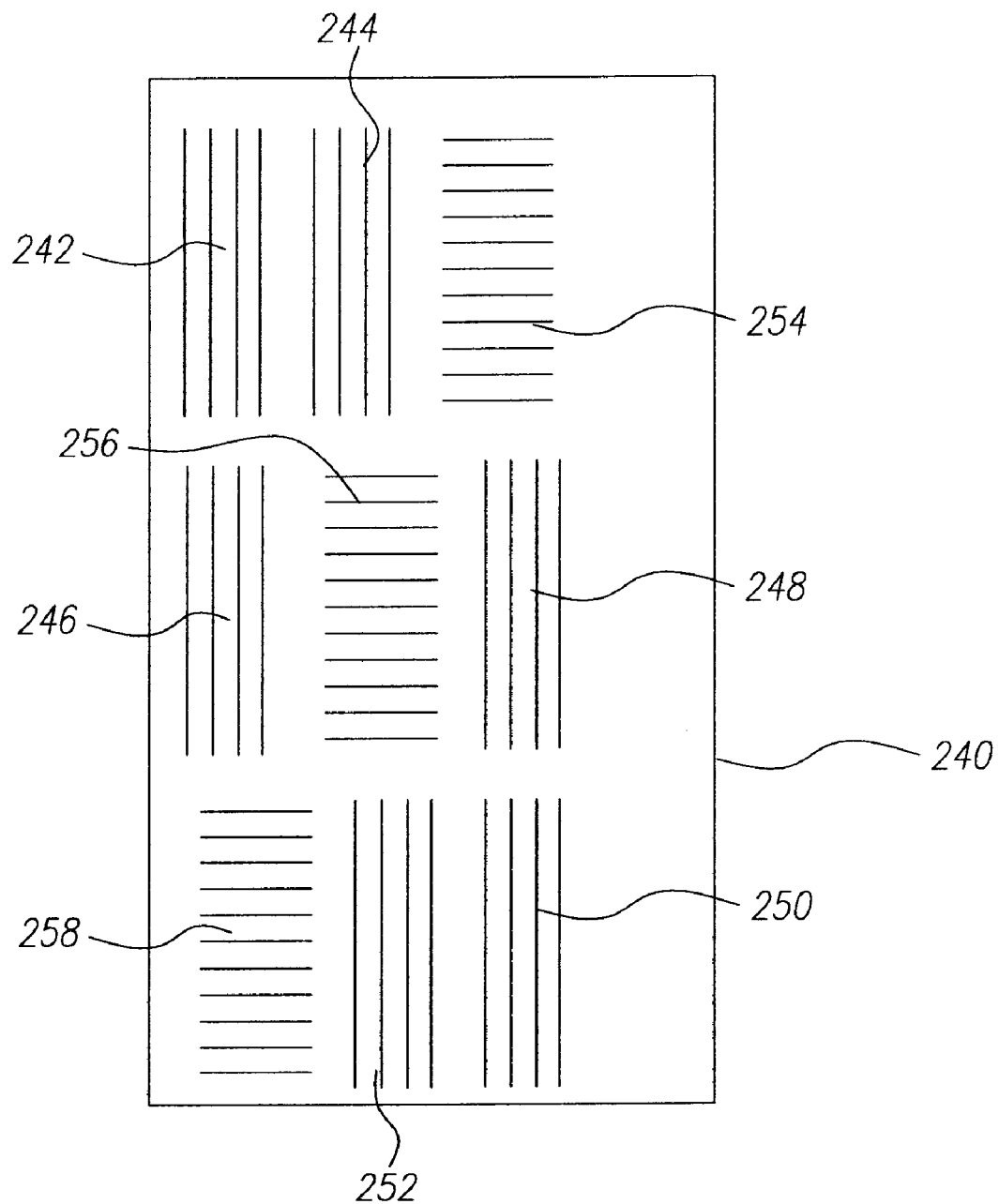
FIG. 7 depicts an alternate arrangement of light-emitting elements useful in practicing an embodiment of the present invention.

It should also be noted that while FIG. 5 shows an arrangement of red and blue light emitting elements wherein there are equal numbers of red and blue light-emitting elements, it is not required that there be equal numbers of each color of light-emitting element within the top layer. FIGS. 6 and 7 show two alternate arrangements of light-emitting elements having fewer blue light emitting elements than red light emitting elements. FIG. 6 shows an alternate arrangement of light-emitting elements within a portion of a display device 232 having two subpixel areas 234, 236 having red light-emitting elements for every subpixel area 238 having a blue light-emitting element. The blue light-emitting element may be patterned to cover two green light-emitting elements within the bottom EL unit 124 or a single green light-emitting element. Likewise, the blue EL unit may be formed between a single pair of electrodes or formed between two pairs of electrodes that are both driven synchronously, using the same drive circuit. FIG. 7 shows a portion of a display device 240, having an alternate arrangement of light-emitting elements wherein an arrangement of six subpixel areas (242 through 252) having red light-emitting elements are intermixed with an arrangement of three subpixel areas (254 through 258) having blue light-emitting elements in a repeating pattern. In this arrangement, the locations of the blue light-emitting elements are offset row to row to provide a more uniform appearance when fields of solid blue are displayed. Alternatively, the locations of the blue light-emitting elements may be offset column to column or by rows and columns to achieve this same goal.

Figure 8:
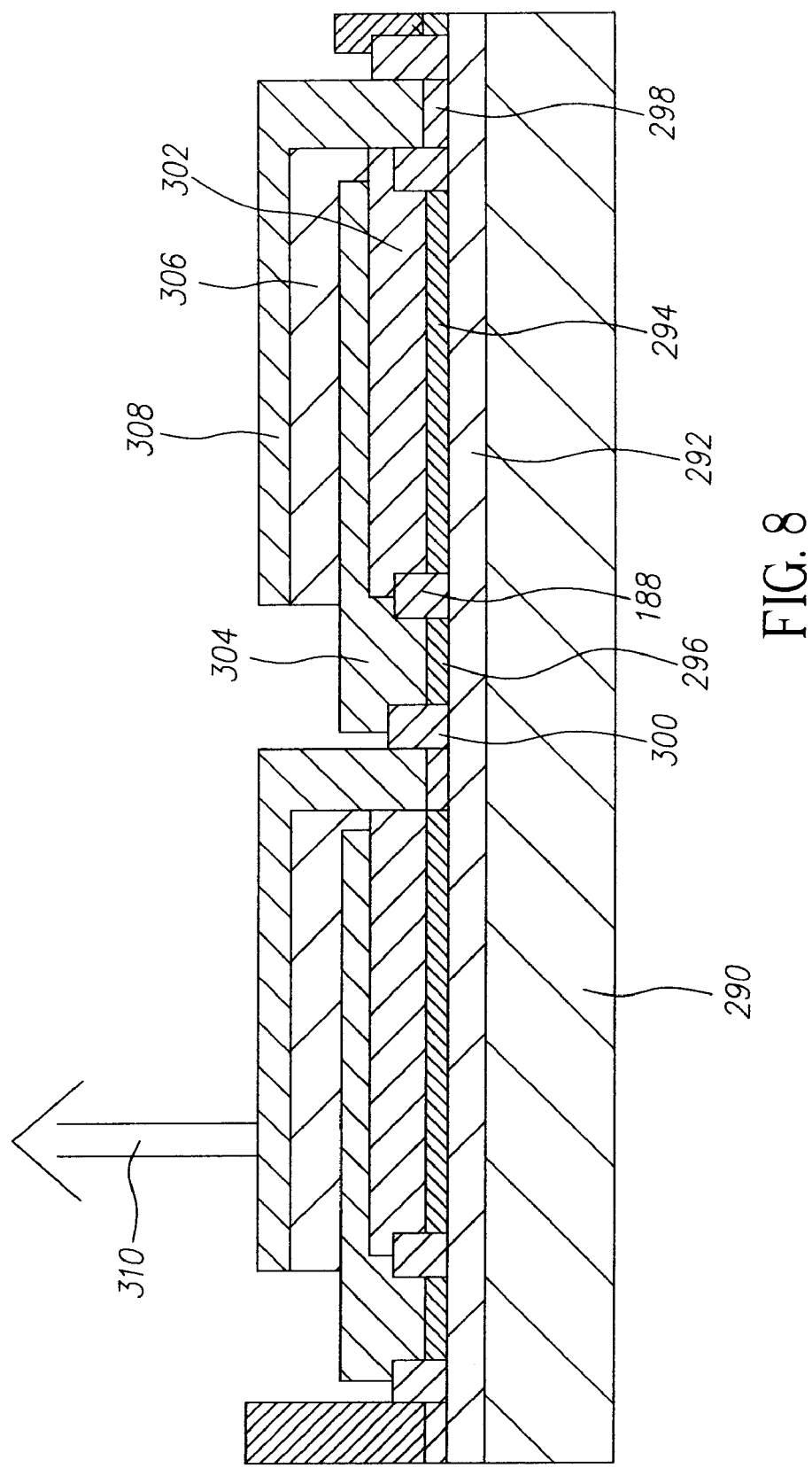
FIG. 8 is a longitudinal cross section of a top-emitting display device of the present invention.

While the display device has been shown in FIG. 3 as a bottom-emitting OLED device, the present invention is not limited to this embodiment. In fact, top-emitting OLED device structures may also be formed and it is possible to enhance the color of the red and blue light-emitting elements by employing a variable microcavity. For example, the device shown in FIG. 8 is a top-emitting OLED device that employs selective microcavities to enhance the red and blue emission. Within this display device, light emission 310 occurs through the top of the display device and is not transmitted through the substrate.

As shown in FIG. 8, the display device is formed on a substrate 290. On this substrate 290 a layer 292 will be formed that contains thin-film transistors and other drive circuitry to drive the device as is known in the art. Over this drive circuitry, dielectric materials 300 will be formed to insulate the electrodes from each other. A first reflective electrode 294 will be patterned together with first 296 and second 298 connectors for the second 304 and third 308 electrodes. A bottom EL unit 302 will be formed on the top of the first electrode 294. A second electrode 304 that is semi-transparent will be connected to the first connector 296 and formed over the bottom EL unit 302. A top EL unit 306 will be formed over the second electrode 304. Finally, the substantially transparent third electrode 308 will be patterned over the top EL unit 304 such that a connection is made to the second connector 298.

Within this embodiment, the bottom EL unit 302 may be patterned to provide emission of either red or blue light within each light emitting element while the top EL unit 306 provides green light within each light emitting element. At least two separate microcavities are formed within the bottom EL unit 302 by spacing the light emission layer within the bottom EL unit 302 differently within different light-emitting elements. This is done by optimizing the microcavity to provide blue emission for some light-emitting elements and red emission for other light-emitting elements. By forming the bottom EL unit such that some light-emitting elements have microcavities that are tuned to emit specific spectral frequencies of light within the red or blue portions of the spectrum, a display device may be constructed to have light-emitting elements that emit very pure red or blue light together with green light similarly to the light that is produced by the device depicted in FIG. 3. Further, the emission from the first EL unit 302 is produced by a microcavity creating very narrowband and therefore very pure red and blue emission.

The specific embodiments discussed thus far have a number of common elements. For example, a semi-transparent second electrode 112 may be employed to form a microcavity within one layer. While the use of a semi-transparent electrode may allow a broader selection of materials to be used for this electrode, it is possible to employ transparent or nearly transparent materials that form very weak or negligible microcavities. Such a display may be advantaged for viewing angle.

Figure 9:
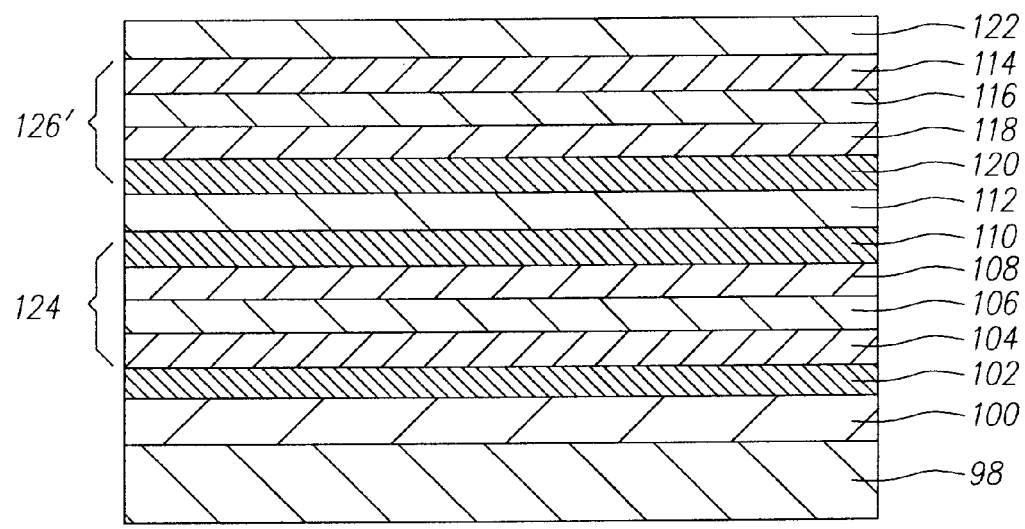
FIG. 9 is a diagram showing a longitudinal cross section of an OLED device of the present invention.

In the previous embodiments, it was shown that the first and second EL units may be formed from similar arrangements of organic material layers. However, these EL units may alternatively be formed in a non-repeating fashion. In another embodiment, the order of the organic layers forming either the first and/or second EL unit may be reversed as shown in FIG. 9. In such an embodiment, the bottom EL unit 124 may be formed similarly as in FIG. 2 consisting of the first optional hole-injecting layer 104 on the first electrode 102, followed by the first hole-transporting layer 106, the first light-emitting layer 108, and the first electron-transporting layer 110. However, the top EL unit 126' is now formed from an inverted layer arrangement in which the second electron-transporting layer 120 is deposited on the second electrode 112, the second light-emitting layer 118 is deposited on the second electron-transporting layer 120, the second hole-transporting layer 116 is deposited on the second light-emitting layer 118 and the second optional hole-injecting layer 114 is deposited on the second electron-transporting layer 116. By forming the device in this way, an electrical potential having the same polarity may be used to drive both the bottom and top EL units within the display device. Such a device structure in which one of the bottom 124 or top 126 EL units are inverted eliminates the need for both positive and negative power lines within the display design as either a negative or positive voltage may then be used to drive both the first and second EL units with a positive bias. This not only simplifies the panel layout by reducing the number of power lines required within an active-matrix display design but simplifies the power supply as it is not necessary to provide both positive and negative voltages to the display panel.

It is also possible to drive an active or passive matrix display device of the current invention to take advantage of the fact that the polarity of the voltages must be different to drive the top and bottom EL units. In fact by connecting the first and third electrodes together in a device having the structure shown in FIG. 2, one can form a display device that, when driven with a positive voltage, allows one of the EL units to emit light and the remaining EL unit to be driven with a reverse bias. In this configuration, only the EL unit that is driven with a positive bias emits light while the second does not. When the polarity of the voltage is switched to provide a negative voltage, the opposing EL unit will be driven with a forward bias and emit light while the EL unit that produced light when driven with a positive voltage will now be driven in reverse bias and not output light. If the voltage is modulated such that the first and second EL units alternatively emit light at a fast rate, the display device will appear to produce a steady light that is the sum of the light produced by the first and second EL units and will have a perceived color that is the average of the color of light produced by the first and second EL units. In a display of the current invention, where the first EL unit emits light primarily in the green portion of the visible spectrum within each light-emitting element, and wherein the second EL unit emits light primarily within red or blue portions of the visible spectrum, a full color display can be produced by cycling between the polarity to allow each of the EL units to produce a controlled amount of light within each light-emitting element. Such a device configuration may be particularly useful in a passive matrix device where common row and columns drivers can be used to drive both the first and second EL units within each subpixel area to achieve a full-color display device.

To practice the device of the current invention, the device will typically be placed into a system that receives a stream of three-color data wherein the input data has equal resolution red, green, and blue input signals. In such a display system, the data may then be mapped to a mosaic of light-emitting elements in which there is more than one element of one color than another. For example, referring to FIG. 5, each subpixel area emits green light while every other subpixel area emits either red or blue light. In such a device, it is desirable that the data that is input to the display device include data for as many pixel areas as the maximum number of any single colored light-emitting element in the display device. For example, if the display device constructed as shown in FIG. 5 has 640×480 subpixel areas, all of which may emit green light, then the input data will ideally include 640×480 data points. Under these circumstances, the red and blue data signals will be downsampled to provide only enough data values to drive each red and blue light-emitting element.

Using the pattern in FIG. 5 again as an example, data values must be calculated for the blue and red values that take into account the fact that there are only half as many red and blue light-emitting elements as there are green light-emitting elements. Further, these calculations should be performed to maintain as much of the image information as is possible. Methods for performing these calculations have been discussed in detail within co-pending, commonly assigned U.S. Ser. No. 11/048,385 filed Feb. 1, 2005 by Miller et al. entitled "Color display device with enhanced pixel pattern", the disclosure of which is herein incorporated by reference. Using methods such as these, calculations will be performed to determine a weighted average for the data locations for which there are light-emitting elements and the neighboring data locations for which there are not light-emitting elements. In a preferred method, each line or region of data will be convolved with a one or two-dimensional kernel and the resulting values will be subsampled according to the sampling lattice of the light-emitting elements.

The invention has been described in detail with particular reference to certain preferred embodiments thereof, but it will be understood that variations and modifications can be effected within the spirit and scope of the invention.

PARTS LIST 10 substrate
12 first electrode
14 first EL unit
16 second electrode
18 second EL unit
20 third electrode
22 third EL unit
24 fourth electrode
100 substrate
102 first electrode
104 first optional hole-injecting layer
105 insulating layer
106 first hole-transporting layer
108 first light-emitting layer
110 first electron-transporting layer
112 second electrode
114 second optional hole-injecting layer
116 second hole-transporting layer
118 second light-emitting layer
120 second electron-transporting layer 122 third electrode
124 bottom EL unit
126 top EL unit
126' inverted top EL unit
140 substrate
142 drive circuitry layer
144 first connector
152 planarization layer
154 second connector
158 light emission
160 first sub-circuit
162 second sub-circuit
164 first diode
166 second diode
168 input data line
170 first select line
172 second select line
174 first power line
176 second power line
178 first TFT
180 third TFT
182 second TFT
184 fourth TFT
186 first capacitor
188 second capacitor
210 display device
212 first subpixel area
214 second subpixel area
216 third subpixel area
218 fourth subpixel area
220 first power line
222 data line
224 second power line
226 first select line
228 second select line
230 capacitor line
232 display device
234 subpixel area having a red light-emitting element
236 subpixel area having a red light-emitting element
238 subpixel area having a blue light-emitting element
240 display device
242 subpixel area having a red light-emitting element
244 subpixel area having a red light-emitting element
246 subpixel area having a red light-emitting element
248 subpixel area having a red light-emitting element
250 subpixel area having a red light-emitting element
252 subpixel area having a red light-emitting element
254 subpixel area having a blue light-emitting element
256 subpixel area having a blue light-emitting element
258 subpixel area having a blue light-emitting element
290 substrate
292 drive circuitry layer
294 first reflective electrode
296 first connector
298 second connector
300 dialectric materials
302 first EL unit
304 second electrode
306 second EL unit
308 third electrode
310 light emission

The invention claimed is:

1. An OLED device, comprising:
a) a first layer of independently addressable light emitting elements; and
b) a second layer of independently addressable light emitting elements located on top of the first layer;
wherein one of the first and second layers of independently addressable light emitting elements comprises a patterned array of red and blue light emitting elements, and the other of the first and second layers of independently addressable light emitting elements comprises an array of green light emitting elements.

2. An OLED device, comprising: a plurality of light emitting elements each comprising an EL unit positioned between and in electrical contact with a pair of electrodes, including individually addressable light emitting elements for emitting red, green and blue colored light, wherein the red and blue light emitting elements are patterned in an array in a common layer and are stacked above or below an array of green light emitting elements.

3. The OLED device of claim 2, wherein neighboring individually addressable red and blue light emitting elements in the patterned array and the associated stacked green light-emitting elements form a pixel.

4. The OLED device of claim 2, wherein electrical potentials between the electrodes of two neighboring green light-emitting elements stacked above or below individually addressable red and blue light emitting elements are controlled by a common signal.

5. The OLED device of claim 2, wherein the area of light emitting elements that emit blue light are larger than the area of light emitting elements that emit red light.

6. The OLED device of claim 2 wherein the location of the red and blue light-emitting elements are interspersed along a row or column of the display device.

7. The OLED device of claim 6 wherein the location of the red and blue light-emitting elements are interspersed along both rows and columns of the display device.

8. The OLED device of claim 2, wherein the number of light-emitting elements emitting red or blue light are different.

9. The OLED device of claim 2, wherein the EL unit of each of the red and blue light emitting elements are positioned between and in electrical contact with pairs of first and second electrodes, and the EL unit of each stacked green light emitting element is positioned between and in electrical contact with the second electrode of a red or blue light emitting element and a third electrode.

10. The OLED device of claim 9, wherein the first electrode of each of the red and blue light emitting element is in electrical contact with the third electrode of a stacked green light emitting element, and wherein a positive bias is alternatively applied to the EL units of the red or blue light emitting element and the stacked green light emitting element at a rate to allow temporal integration of the light emitted from the EL units of the stacked light emitting elements, allowing the device to be perceived as a full-color display device.

11. The OLED device of claim 10, wherein the EL unit of the stacked green light emitting element is formed from an inverted stack of organic material layers relative to the order of organic material layers in the EL unit of the red or blue light emitting element, such that the second electrode serves as either the cathode or anode for both the EL units.

12. The OLED device of claim 2, wherein the EL units of at least one of the red, green or blue light emitting elements is comprised of tandem light-emitting layers.

13. The OLED deice of claim 2 wherein at least one of the light emitting elements comprises a microcavity.

14. The OLED device of claim 2, wherein the EL units of the green light emitting elements are formed from at least one unpatterned deposited organic layer.

15. The OLED device of claim 14, wherein the unpatterned deposited organic layer of the green light-emitting elements is formed in a common vapor deposition step.

16. The OLED device of claim 2 wherein the EL units of the red and blue light emitting elements in the patterned array in a common layer are formed by patterned vapor deposition.

17. The OLED device of claim 2 wherein the EL units of the red and blue light emitting elements in the patterned array in a common layer are formed by patterned laser transfer deposition from a donor sheet.

18. A display system employing the OLED device of claim 2, further comprising a means for controlling the arrays of light-emitting elements to produce a full-color image in response to an input data signal.

19. The display system of claim 18, wherein the means for controlling includes a means for resampling the input data signal.

* * * * *